(12) United States Patent
Kobayashi et al.

(10) Patent No.: US 7,754,600 B2
(45) Date of Patent: Jul. 13, 2010

(54) METHODS OF FORMING NANOSTRUCTURES ON METAL-SILICIDE CRYSTALLITES, AND RESULTING STRUCTURES AND DEVICES

(75) Inventors: Nobuhiko Kobayashi, Sunnyvale, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 443 days.

(21) Appl. No.: 11/712,632

(22) Filed: Mar. 1, 2007

(65) Prior Publication Data

US 2008/0213603 A1    Sep. 4, 2008

(51) Int. Cl.
*H01L 21/4763* (2006.01)
(52) U.S. Cl. .................. 438/630; 438/682; 257/E21.13
(58) Field of Classification Search ................. 438/630, 438/682, 663, 664, E21.13; 977/742, 762
See application file for complete search history.

(56) References Cited

U.S. PATENT DOCUMENTS

| | | | |
|---|---|---|---|
| 5,681,759 A | 10/1997 | Zhang et al. | |
| 5,904,770 A | 5/1999 | Ohtani et al. | |
| 5,956,579 A | 9/1999 | Yamazaki et al. | |
| 6,319,761 B1 | 11/2001 | Zhang et al. | |
| 6,997,985 B1 | 2/2006 | Yamazaki | |
| 7,507,390 B2 * | 3/2009 | Choi ........................... | 423/344 |
| 2004/0142560 A1 * | 7/2004 | Kuo et al. ................... | 438/682 |
| 2006/0208257 A1 | 9/2006 | Branz et al. | |

FOREIGN PATENT DOCUMENTS

| | | |
|---|---|---|
| KR | 1019990078293 | 10/1999 |
| KR | 102004008319 | 10/2004 |
| KR | 1020070004774 | 1/2007 |

OTHER PUBLICATIONS

Ertekin, Elif et al., "Equilibrium limits of coherency in strained nanowire heterostructures", Journal of Applied Physics, vol. 97, 2005, pp. 1-10.
Kobayashi, N.P., et al., "Growth and characterization of indium phosphide single-crystal nanoneedles on microcrystalline.silicon surfaces", Ajpplied Physics A,.vol. 85, 2006.

* cited by examiner

*Primary Examiner*—Hoai v Pham

(57) ABSTRACT

Various embodiments of the present invention are directed to methods of forming nanostructures on non-single crystal substrates, and resulting nanostructures and nanoscale functional devices. In one embodiment of the present invention, a method of forming nanostructures includes forming a multi-layer structure comprising a metallic layer and a silicon layer. The multi-layer structure is subjected to a thermal process to form metal-silicide crystallites. The nanostructures are grown on the metal-silicide crystallites. In another embodiment of the present invention, a structure includes a non-single-crystal substrate and a layer formed over the non-single-crystal substrate. The layer includes metal-silicide crystallites. A number of nanostructures may be formed on the metal-silicide crystallites. The disclosed structures may be used to form a number of different types of functional devices for use in electronics and/or optoelectronics devices.

10 Claims, 13 Drawing Sheets

METHODS OF FORMING NANOSTRUCTURES ON METAL-SILICIDE CRYSTALLITES, AND RESULTING STRUCTURES AND DEVICES

TECHNICAL FIELD

Embodiments of present invention are related generally to nanoscale-electronic devices and nanoscale-optoelectronic devices. More particularly, embodiments of the present invention relate to methods of forming nanostructures on non-single-crystal substrates, and resulting structures and devices.

BACKGROUND

Manufacturers and designers of integrated circuits continue to relentlessly decrease the size of integrated-circuit features, such as transistors and signal lines, and correspondingly increase the density at which features can be fabricated within integrated circuits. For example, the next generation integrated circuits and data-transmission architectures may include both electronics and optoelectronics to create high-density, high-speed, and high-capacity devices. Manufacturers and designers have begun to approach fundamental physical limits that prevent further decreasing feature sizes in such integrated circuits fabricated by conventional photolithography techniques. Recent research efforts have turned to new, non-photolithography-based techniques for fabricating nanoscale electronics and nanoscale optoelectronics that represent a significant decrease in feature sizes from currently available, submicroscale electronics fabricated by currently available high-resolution photolithographic techniques.

In one approach to designing and fabricating nanoscale functional devices, "one-dimensional" nanostructures, such as nanowires, and "zero-dimensional" nanostructures, such as quantum dots, can be fabricated by epitaxial growth on a surface of a single-crystal semiconductor substrate. In nanowire-based devices, nanowire junctions representing the closest point of contacts between adjacent nanowires may be fabricated to have properties of configurable resistors, switches, diodes, transistors, and other familiar electronic components of integrated circuits. In other approaches, nanowires with a crossbar architecture can be formed. The grid-like nanowire crossbars provide a two-dimensional array of nanowire junctions that can be configured to form a variety of different types of functional devices or sub-systems in electronics and optoelectronics. In addition to being used to form nanowire junctions, nanowires have also found utility in sensors, as interconnects, and in a number of other applications. Quantum-dot-based devices, which are a relatively more mature technology than nanowire-based devices, can be utilized in a various electronic and optoelectronic applications. Quantum dots formed by epitaxial growth can be used for forming various types of nanoscale-electronic and nanoscale-optoelectronic devices that take advantage of the unique properties provided by the nanoscale dimensions of the quantum dots.

Fabrication of nanowires and quantum dots has often been performed by epitaxially growing single-crystal nanowires or quantum dots on a surface of a suitable single-crystal semiconductor substrate to ensure high-quality epitaxial growth and to enable electrical access to individual nanostructures or groups of nanostructures. However, the cost single-crystal semiconductor substrates, such as single-crystal silicon wafers and single-crystal gallium arsenide wafers, are very expensive. Moreover, the world-wide demand for single-crystal silicon wafers appears to be rapidly increasing, which will further increase the price for single-crystal silicon wafers. Therefore, researchers and developers of nanoscale devices continue to seek more affordable and versatile material platforms and techniques to fabricate electrically accessible high-quality, single-crystal nanostructures for nanoscale functional devices.

SUMMARY

Various embodiments of the present invention are directed to methods of forming nanostructures on non-single crystal substrates, and resulting structures and nanoscale functional devices. In one embodiment of the present invention, a method of forming nanostructures includes forming a multi-layer structure comprising a metallic layer and a silicon layer. The multi-layer structure is subjected to a thermal process to form metal-silicide crystallites. The nanostructures are grown on the metal-silicide crystallites.

In another embodiment of the present invention, a structure includes a non-single-crystal substrate and a layer formed over the non-single-crystal substrate. The layer includes metal-silicide crystallites. A number of nanostructures may be formed on the metal-silicide crystallites. The disclosed structures may be used to form a number of different types of functional devices for use in electronics and/or optoelectronics devices.

BRIEF DESCRIPTION OF THE DRAWINGS

The drawings illustrate various embodiments of the present invention, wherein like reference numerals refer to like elements or features in different views or embodiments shown in the drawings.

DETAILED DESCRIPTION OF VARIOUS EMBODIMENTS

Various embodiments of the present invention are directed to methods of forming single-crystal nanostructures on non-single crystal substrates, and resulting structures and nanoscale functional devices. The nanostructures may be grown as quantum dots or nanowires, and such nanostructures may be employed in a variety of different types of nanoscale-electronic devices and nanoscale-optoelectronic devices.

Figure 1:
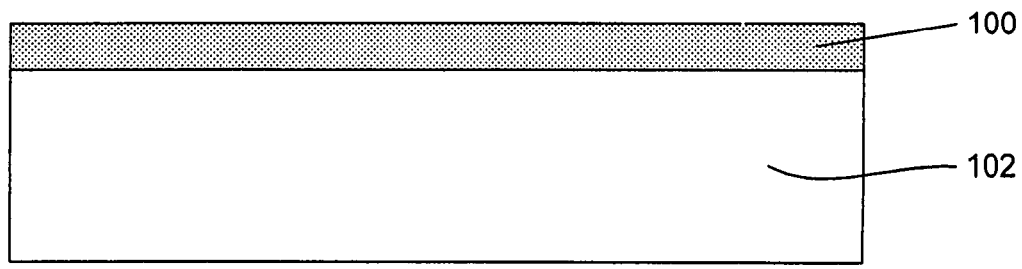
FIG. 1 is a schematic side view of an in-process substrate structure, formed during practice of one embodiment of a method according to the present invention, including a metallic layer deposited on a substrate.

FIGS. 1 through 6 illustrate various stages in a method of growing nanostructures, such as nanowires or quantum dots, on metal-silicide crystallites according to one embodiment of a method of the present invention. As shown in FIG. 1, a metallic layer 100 is deposited on a substrate 102 by any physical or chemical deposition technique, such as sputtering, electron-beam evaporation, or another suitable deposition technique. The metallic layer 100 may have a thickness of, for example, about 1 nm to about 1 µm. The metallic layer 100 may comprise metals or alloys capable of reacting with silicon to form a metal silicide. For example, the metallic layer 100 may comprise one or more transition metals (e.g., Sc, Ti, V, Cr, Mn, Fe, Co, Ni, Cu, Zn, Y, Zr, Nb, Mo, Pd, Ag, Ta, W, Pt, Au), Al, one or more rare earth metals (e.g., Er, Dy, Gd, Th, Ho, Tb, Sm), or another suitable metal or alloy capable of forming a metal silicide. In some embodiments of the present invention, the metallic layer 100 may be a multi-layer film including metallic layers having different compositions. The substrate 102 may be formed from a number of materials, such as non-single-crystal materials, that are relatively inexpensive compared to traditional single-crystal semiconductor substrates. For example, the substrate 102 may be a glass substrate, a polycrystalline metallic substrate (e.g., stainless steel), a polymeric substrate, a non-single crystal semiconductor substrate, a metal-oxide substrate, or another suitable substrate that is compatible with subsequent processing acts.

Figure 2:
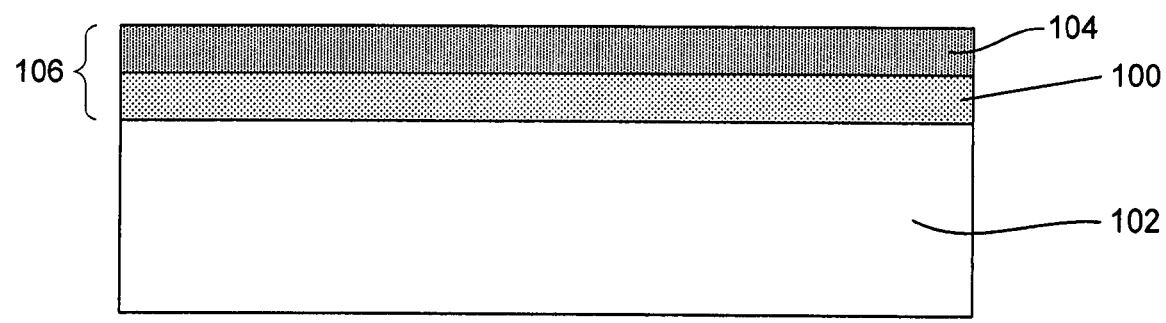
FIG. 2 is a schematic side view of an in-process substrate structure, formed during practice of one embodiment of a method according to the present invention, after a silicon layer is deposited on the metallic layer shown in FIG. 1.

As shown in FIG. 2, a silicon layer 104 is deposited on the metallic layer 100 to form a multi-layer structure 106. The silicon layer 104 may have a thickness of, for example, about 1 nm to about 1µm. Depending upon the thickness of the silicon layer 104, the silicon layer 104 includes amorphous silicon, or silicon crystallites having a size of, for example, about 1 nm to about 100 µm dispersed through an amorphous silicon matrix. For example, when the silicon layer 104 is a layer of hydrogenated silicon, during deposition, the layer of hydrogenated silicon is initially deposited in an amorphous phase. As the thickness of the layer of hydrogenated silicon increases during the deposition process, silicon crystallites nucleate that are dispersed through an amorphous silicon matrix. Hydrogen present in the layer of hydrogenated silicon may passivate any dangling bonds of the silicon atoms. In one embodiment of the present invention, the silicon layer 104 may be deposited as a layer of hydrogenated silicon using plasma-enhanced chemical vapor deposition ("PECVD"), reactive sputtering, or another suitable deposition technique to form amorphous silicon, or a mixture of amorphous silicon and silicon crystallites. The silicon layer 104 may also be heavily doped to increase the electrical conductivity with n-type or p-type dopants that may be introduced during the deposition process or after deposition in a post-deposition process, such as an implantation or diffusion process. Hydrogenated silicon is often referred to in the semiconductor-processing field as "microcrystalline silicon" or "µc-Si". However, it should be emphasized that the terms "microcrystalline silicon" or "µc-Si" are a misnomer because the silicon crystallites may have a wide range of dimensions that includes dimensions that are nanometer in scale.

Figure 3:
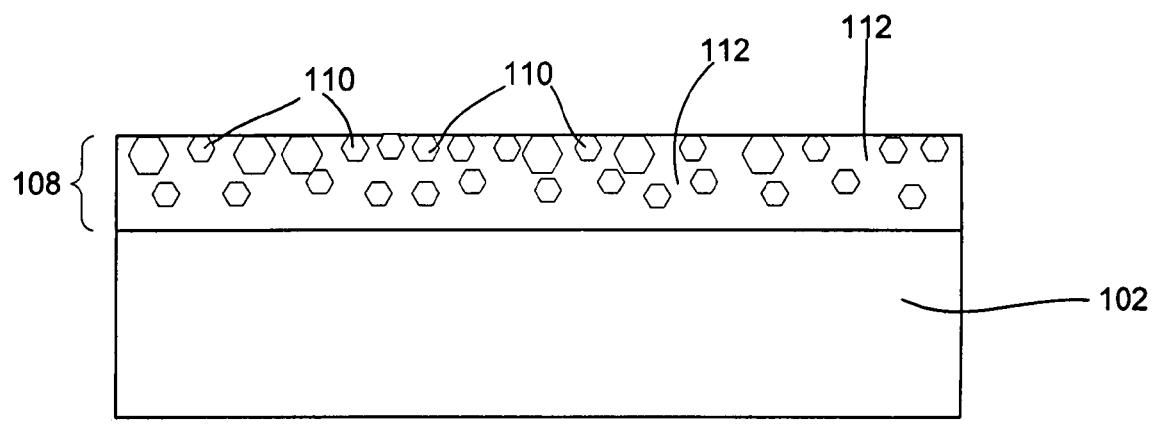
FIG. 3 is a schematic side view of an in-process substrate structure, formed during practice of one embodiment of a method according to the present invention, including metal-silicide crystallites formed as a result of a diffusive reaction between the metallic layer and the silicon layer shown in FIG. 2.
Figure 4:
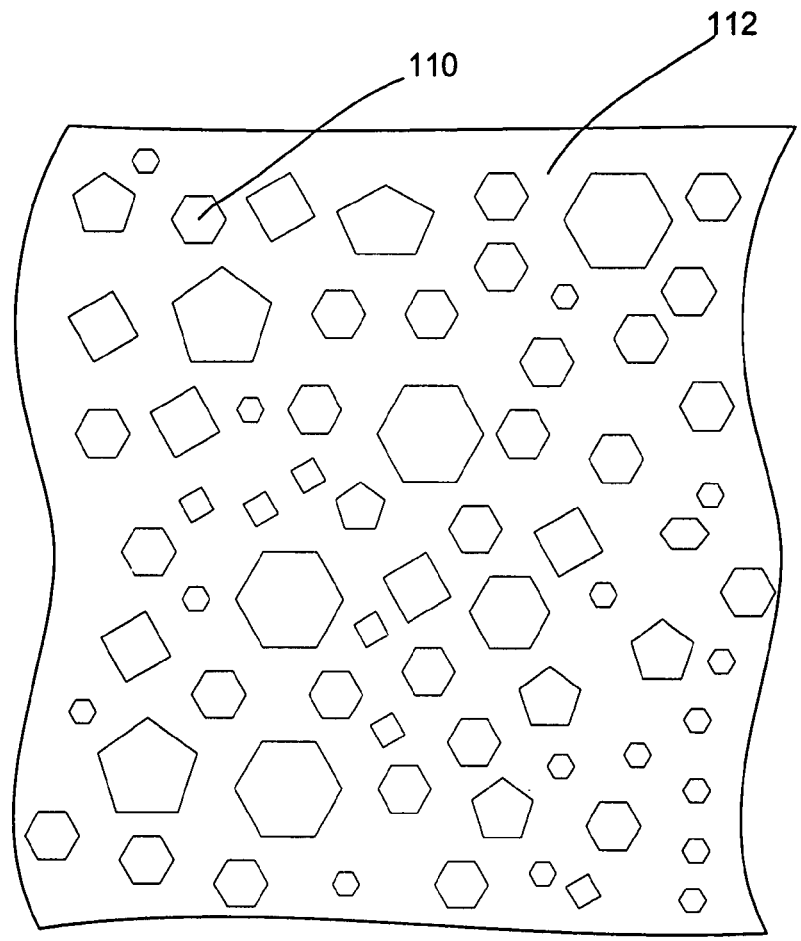
FIG. 4 is a schematic, enlarged, top plan view of the in-process substrate structure shown in FIG. 3.

As shown in the side view of FIG. 3 and the top plan view of FIG. 4, after forming the multi-layer structure 106, the multi-layer structure 106 may be subjected to a thermal process to cause a diffusive reaction to occur between the metallic layer 100 and the silicon layer 104 to form a reaction layer 108. The reaction layer 108 includes metal-silicide crystallites 110 randomly dispersed through an amorphous matrix 112. However, the metal-silicide crystallites 110 may have a preferred crystallographic orientation or texture within the amorphous matrix 112. The volume fraction of the metal-silicide crystallites 110 within the reaction layer 108 may vary from a small, indeterminate amount to approximately one-hundred percent. The metal-silicide crystallites 110 may be a binary silicide, a ternary silicide, or another type of silicide depending upon the composition of the metallic layer 100 and the thermal processing, and the phrase "metal silicide," as used herein, encompasses any of such silicides. For example, when the metallic layer 100 is a chromium layer, the metal-silicide crystallites 110 formed during the thermal process comprise chromium silicide. Different phases of metal-silicides may also be present in the reaction layer 108. The average size of the metal-silicide crystallites 110 may be, for example, about 2 nm to about 100 µm. The amorphous matrix 112 may have a similar or the same chemical composition as the metal-silicide crystallites 110, but atoms of the amorphous matrix 112 lack significant long range order to form an ordered crystal structure. In one embodiment of the present invention, the thermal process is an annealing process in which the multi-layer structure 106 is heated to a temperature between about 100° Celsius and 1000° Celsius for a sufficient amount of time to allow formation of the metal-silicide crystallites 110 due to a diffusive reaction between the metallic layer 100 and the silicon layer 104.

In another embodiment of the present invention, the silicon layer 104 is formed on the substrate 102, followed by forming the metallic layer 100 on the silicon layer 104 using any of the previously described deposition techniques. Subjecting such a structure to a thermal process, as described above, will also result in formation of a reaction layer comprising metal-silicide crystallites as previously described with respect to FIGS. 3 and 4.

Figure 5:
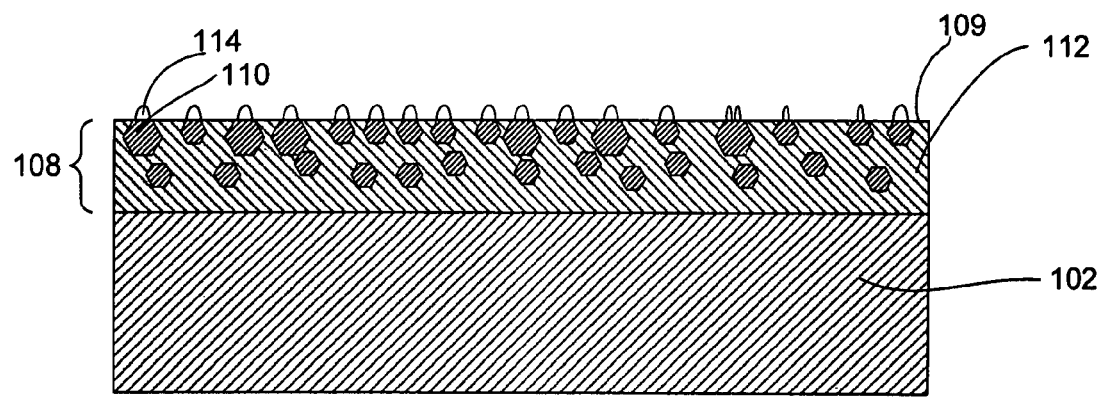
FIG. 5 is a schematic cross-sectional view of an in-process substrate structure, formed during practice of one embodiment of a method according to the present invention, after nanostructures are preferentially grown on the metal-silicide crystallites shown in FIGS. 3 and 4.
Figure 6A:
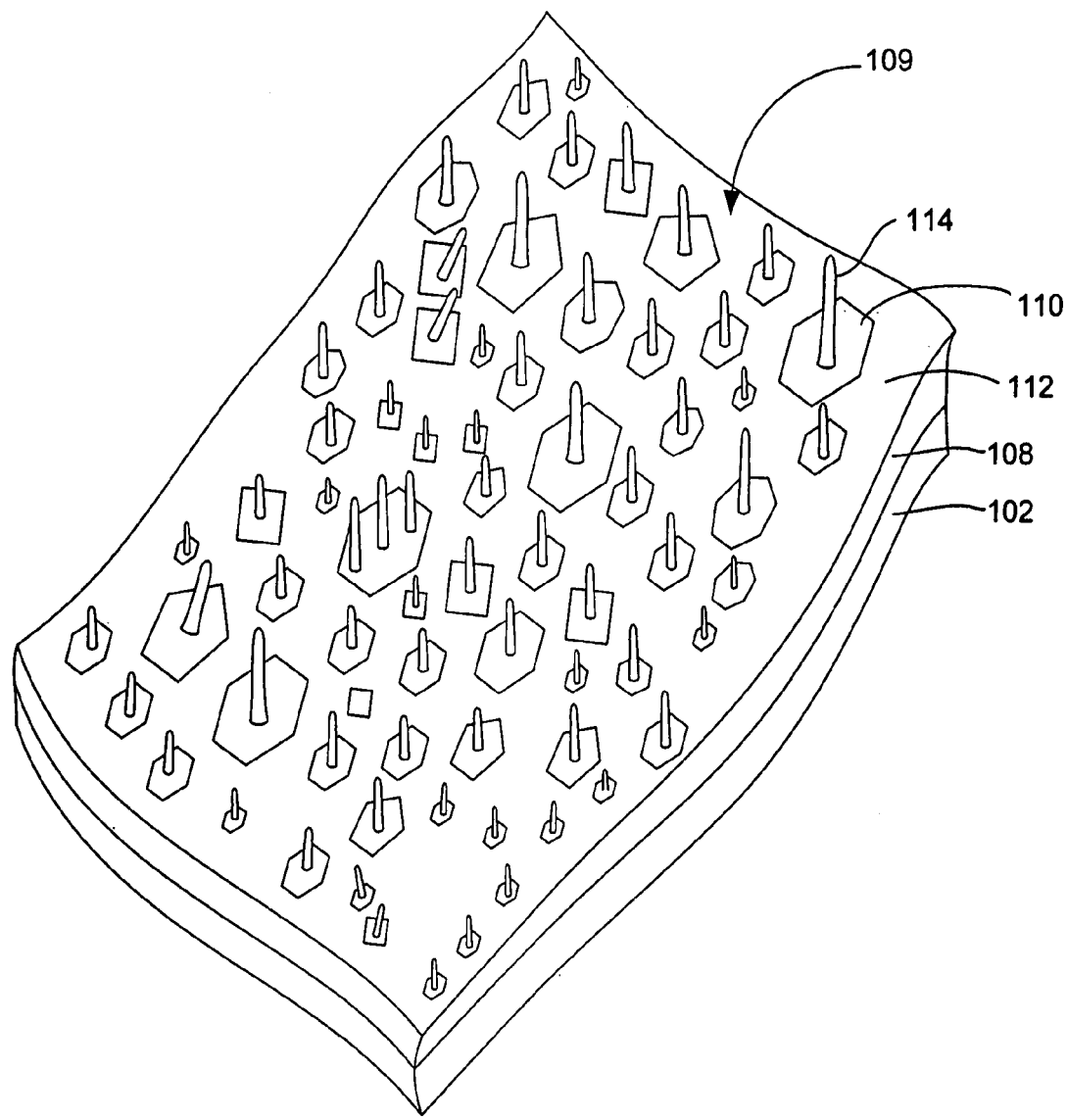
FIG. 6A is a schematic, enlarged, top isometric view of the in-process substrate structure shown in FIG. 5.
Figure 6B:
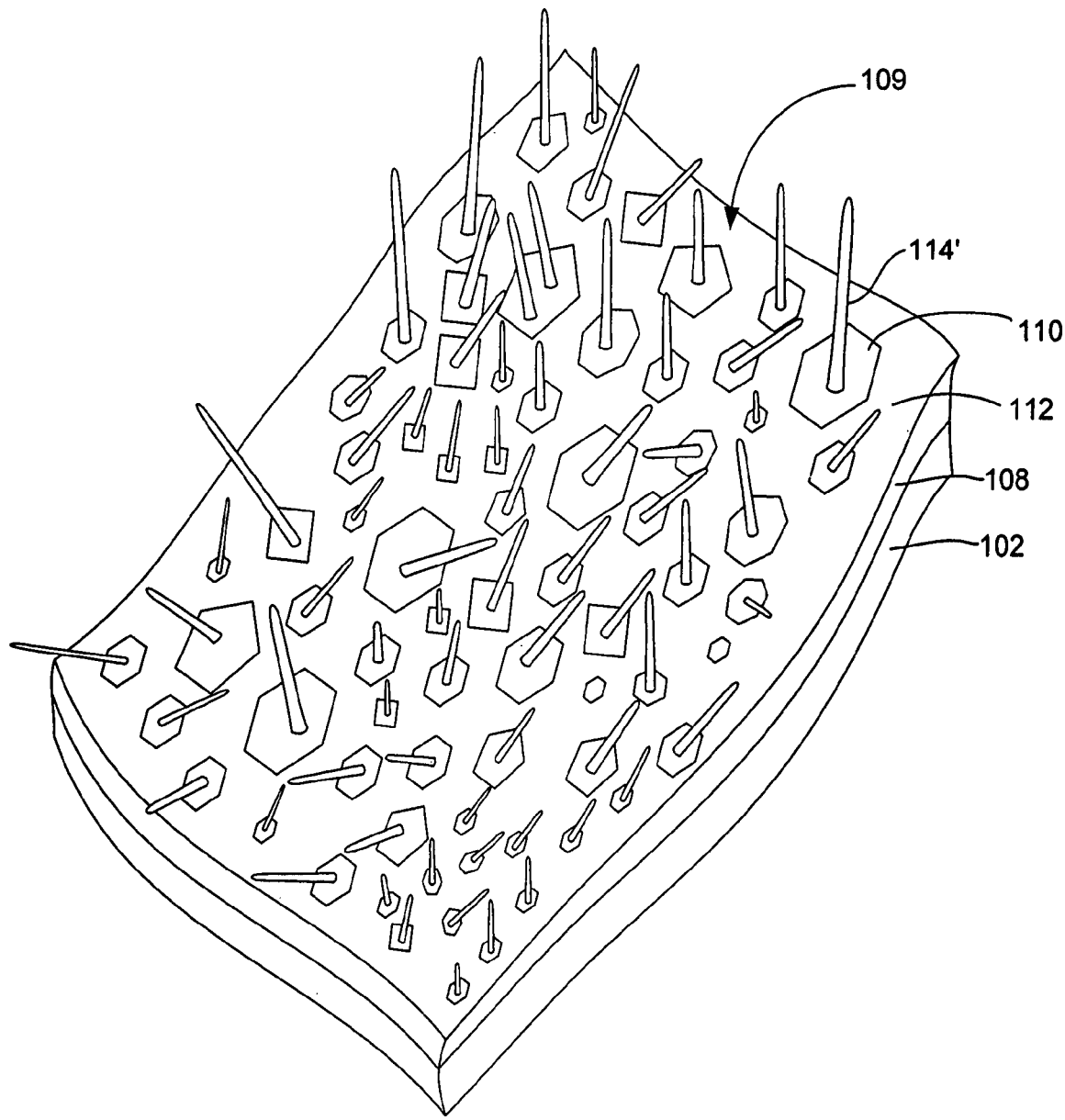
FIG. 6B is a schematic, enlarged, top isometric view of the in-process substrate structure shown in FIG. 5, with nanowires preferentially grown on the metal-silicide crystallites.

As shown in FIGS. 5 and 6A, following the formation of the metal-silicide crystallites 110, a number of nanostructures 114 are preferentially grown on the metal-silicide crystallites 110 present on a surface 109 of the reaction layer 108. The metal-silicide crystallites 110 may function as seed crystals so that the nanostructures 114 preferentially grow on the metal-silicide crystallites 110 instead of the amorphous matrix 112, and the nanostructures 114 may grow epitaxially on the metal-silicide crystallites 110. More than one of the nanostructures 114 may also be formed on a relatively larger corresponding metal-silicide crystallite 110. In one embodiment of the present invention, each of the nanostructures 114 may comprise a quantum dot having a diameter or lateral dimension of, for example, about 2 nm to about 50 nm. In another embodiment of the present invention, each of the nanostructures 114 may comprise a nanowire having a diameter or lateral dimension of, for example, about 2 nm to about 500 nm and a length of, for example, about 10 nm to about 100 μm. As shown in FIG. 6B, when the nanostructures are grown as nanowires 114', each of the nanowires 114' project outwardly from the surface of the metal-silicide crystallite 110 on which the nanowires 114' are grown. The nanowires 114' may project in random directions due to the random orientation of the metal-silicide crystallites 110 on which the nanowires 114' are grown. The nanowires 114' may be formed by continuing the deposition process used for forming the quantum dots for a sufficient time to allow a high-aspect ratio nanowire to be formed, with the length of the nanowires 114' projecting outwardly from the surface of the metal-silicide crystallite 110 on which the nanowire 114' is grown.

The nanostructures 114 and 114' may be formed from a number of different single-crystal semiconductor and insulator materials. According to various embodiments of the present invention, the nanostructures 114 and 114' may be formed from Group IV semiconductors (e.g., Si, Ge), Group II-VI semiconductor compounds (e.g., ZnO, ZnSe), Group III-V semiconductor compounds (e.g., GaAs, InAs, and InP), metal oxides, or another suitable material. The nanostructures 114 and 114' may be formed by a chemical vapor deposition ("CVD") process, such as metal-organic CVD ("MOCVD"). For example, InP quantum dots may be preferentially grown on the metal-silicide crystallites 110 by MOCVD using trimethylindium ("$(CH_3)_3In$") and phosphine ("$PH_3$") in a hydrogen carrier gas, with the in-process substrate structure shown in FIGS. 3 and 4 heated to a temperature between about 300° Celsius to about 500° Celsius. The nanowires 114' may be formed by continuing the deposition process used for forming the quantum dots for a sufficient time and under specific deposition conditions to allow a high-aspect ratio nanowire to be formed. For example, in one embodiment of the present invention, the precursor gas composition used in the MOCVD deposition process may be altered to suppress or reduce lateral growth of the nanostructure relative to the longitudinal growth in order to form the nanowires 114'. In another embodiment of the present invention, metal-catalyst nanoparticles (e.g., Au, Ag, or Ti nanocrystals) may be deposited over the exposed surface 109 of the reaction layer 108. Growth of the nanowires 114' may occur using a vapor-liquid-solid growth process in which the precursor gas materials dissolve in the metal-catalyst nanoparticles and deposits epitaxially on the metal-silicide crystallites 110 underlying the metal-catalyst nanoparticles to form the nanowires 114'. For example, in one specific embodiment of the present invention, gold colloidal metal-catalyst nanoparticles dispersed in toluene may be applied to the surface 109 of the reaction layer 108.

In other embodiments of the present invention, a separate annealing process does not need to be used to form the metal-silicide crystallites 110. Instead, the in-process substrate structure shown in FIG. 2 is provided in an apparatus for growing the nanostructures, such as a chamber of a CVD apparatus. The temperature at which the nanostructure-growth process is performed is sufficient to form the metal-silicide crystallites 110 and grow the nanostructures on the metal-silicide crystallites so-formed. The formation of the metal-silicide crystallites 110 and the growth of nanostructures on the metal-silicide crystallites 110 so-formed may occur substantially simultaneously, with the metal-silicide crystallites 110 formed followed shortly thereafter by growth of the nanostructures on the metal-silicide crystallites 110 so-formed.

Figure 7:
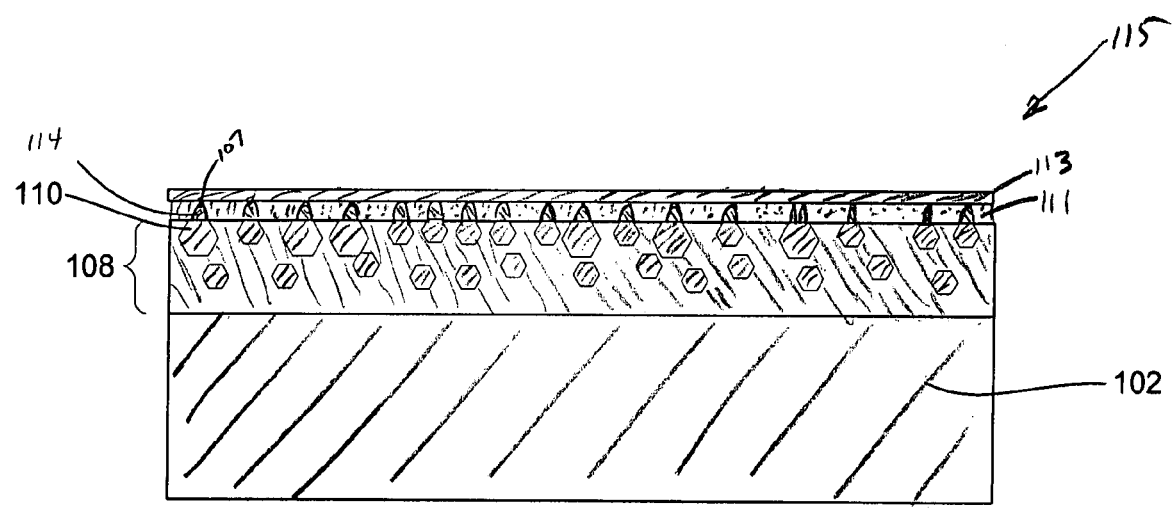
FIG. 7 is a schematic cross-sectional view of a device component for use in electronic and/or optoelectronic devices that utilizes nanostructures preferentially grown on metal-silicide crystallites according to one embodiment of the present invention.

A number of different types of device components for use in optoelectronic and/or electronic devices may be formed by growing the nanostructures 114 on the metal-silicide crystallites 110. FIG. 7 shows a device component 115 suitable for use in a variety of different electronic and/or optoelectronic devices according to one embodiment of the present invention. In the device component 115, the reaction layer 108 may function as a first electrode. A support material 111, such as a metal oxide, a polymeric material, a semiconductor material, or another suitable material may be deposited between adjacent nanostructures 114 to mechanically support the nanostructures 114 and electrically isolate the nanostructures 114 from each other. If necessary, ends 107 of the nanostructures 114 may be exposed by planarizing the support material 111 and the nanostructures 114, or etching the support material 111 and the nanostructures to expose the ends 107. Next, a second electrode 113 may be formed over the nanostructures 114 and in electrical contact with at least a portion of or all of the nanostructures 114. The second electrode 113 may comprise a metallic material, such as an elemental metal or an alloy. The second electrode 113 may also comprise metal-silicide crystallites formed by depositing a silicon layer and a metallic layer to form a multi-layer structure on the support material 111 and the nanostructures 114, followed by reacting the two layers to form the metal-silicide crystallites in the same or similar manner as employed for the reaction layer 108. By forming at least the reaction layer 108 (i.e., the first electrode) from a material comprising metal-silicide crystallites, the first electrode exhibits an electrical conductivity substantially greater compared to highly-doped semiconductor materials. Accordingly, response time and other performance characteristics of the device component 115 may be enhanced when the electrodes comprise metal-silicide crystallites.

When the nanostructures 114 are quantum dots, the support material 111 may be selected from a suitable semiconductor material having an energy band gap greater than the energy band gap of the quantum dot. In another embodiment of the present invention, the nanostructures 114 may be configured as semiconductor nanowires, and the first electrode (i.e., the reaction layer 108), the semiconductor nanowires, and the second electrode 113 form a metal-semiconductor-metal ("MSM") photodiode for use in, for example, photodetection and photoelectric applications, such as photodetectors and solar cells. In such an embodiment, the support material 111 may be transparent to a selected wavelength or range of wavelengths of light that the semiconductor nanowires of the MSM photodiode are designed to absorb. In other embodiments of the present invention, the support material 111 may be selectively removed after forming the second electrode 113 by, for example, a selective chemical etching process.

Figure 8:
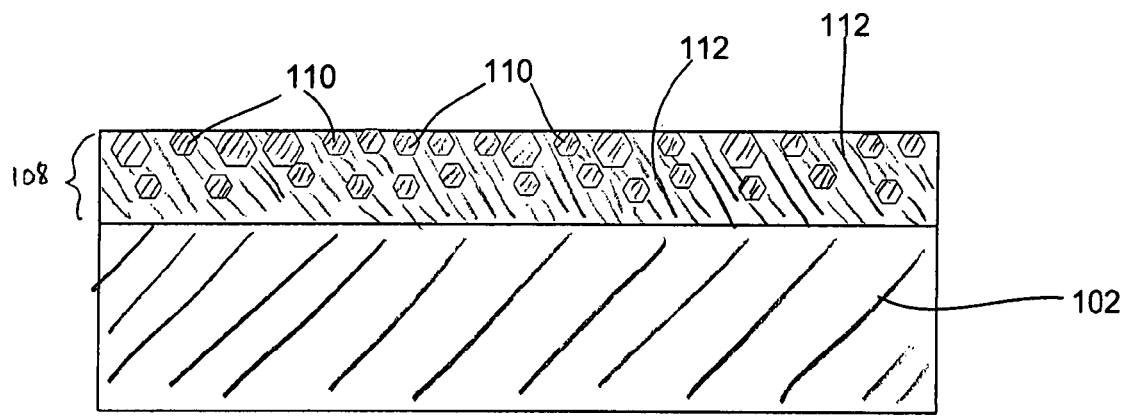
FIGS. 8 through 10 are schematic cross-sectional views that illustrate various stages in a method of fabricating an device component for use in electronic and/or optoelectronic devices according to yet another embodiment of the present invention.
Figure 9:
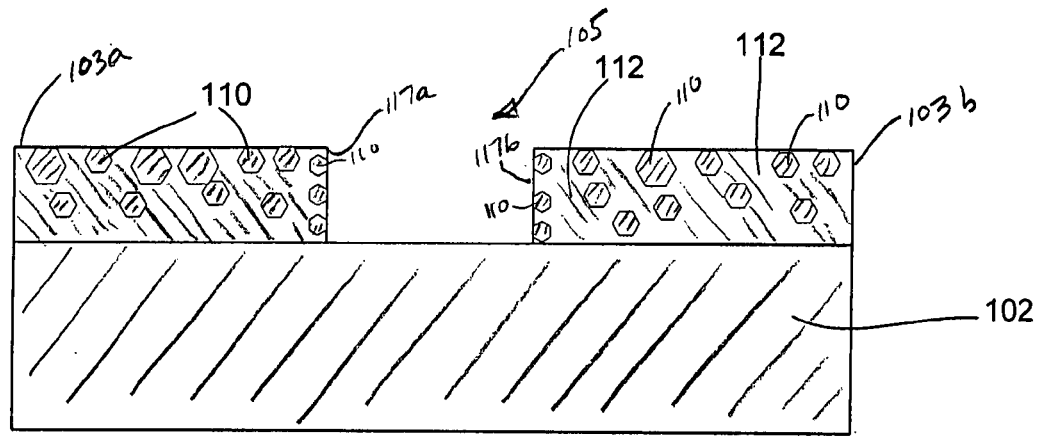
Figure 10:
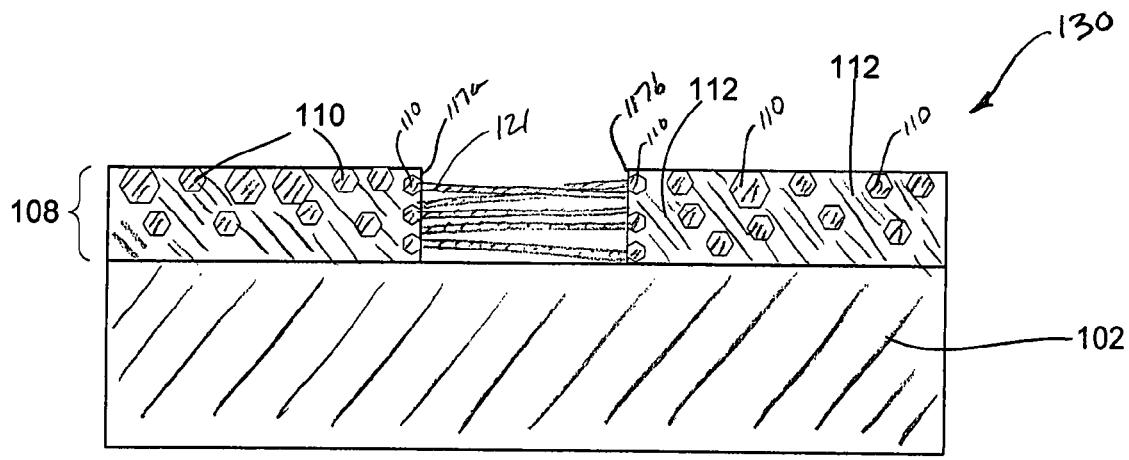

FIGS. 8 through 10 shows various stages in a method of fabricating a device component for use in electronic and/or an optoelectronic devices that also utilizes nanostructures preferentially grown on metal-silicide crystallites according to yet another embodiment of the present invention. As shown in FIG. 8, the in-process substrate structure shown in FIG. 3 is provided. Next, as shown in FIG. 9, electrodes 103*a* and 103*b* are formed by defining a recess 105 in the reaction layer 108. The recess 105 may be formed by photolithographically patterning and etching the reaction layer 108 or another suitable selective material removal process. As illustrated in FIG. 9, sidewalls 117*a* and 117*b* of the electrodes 103*a* and 103*b* have exposed metal-silicide crystallites 110. Next, as shown in FIG. 10, nanostructures 121 are preferentially grown on the metal-silicide crystallites 110 on the sidewalls 117*a* and 117*b*, as previously described, to form a device component 130. Each of the nanostructures 121, which are illustrated as nanowires, grow from one of the sidewalls 117*a* and 117*b* to contact the other of the sidewalls 117*a* and 117*b* to establish an electrical connection between the electrodes 103*a* and 103*b*. It is noted that because the substrate 102 may be an electrically insulating material such as a polymeric material or glass, the electrodes 103*a* and 103*b* are electrically isolated from each other. If necessary, any nanostructures 121 that may grow on exposed upper surfaces of the electrodes 103*a* and 103*b* may be removed using a planarization process. In another embodiment of the present invention, electrodes may be formed by defining a recess in the multi-layer structure 106 shown in FIG. 2 and metal-silicide crystallites may be formed in situ during growth of the nanostructures that interconnect the electrodes to form a device component similar to the device component 130.

The various embodiments described above for preferentially forming single-crystal nanostructures on a non-single-crystal substrate comprising metal-silicide crystallites may be used to fabricate a number of different functional devices in which the nanostructures may be accessed individually or accessed in groups. FIGS. 11A through 17 illustrate stages in a method of forming a functional device that includes nanostructures grown on patterned address lines comprising metal-silicide crystallites according to various embodiments of the present invention.

Figure 11A:
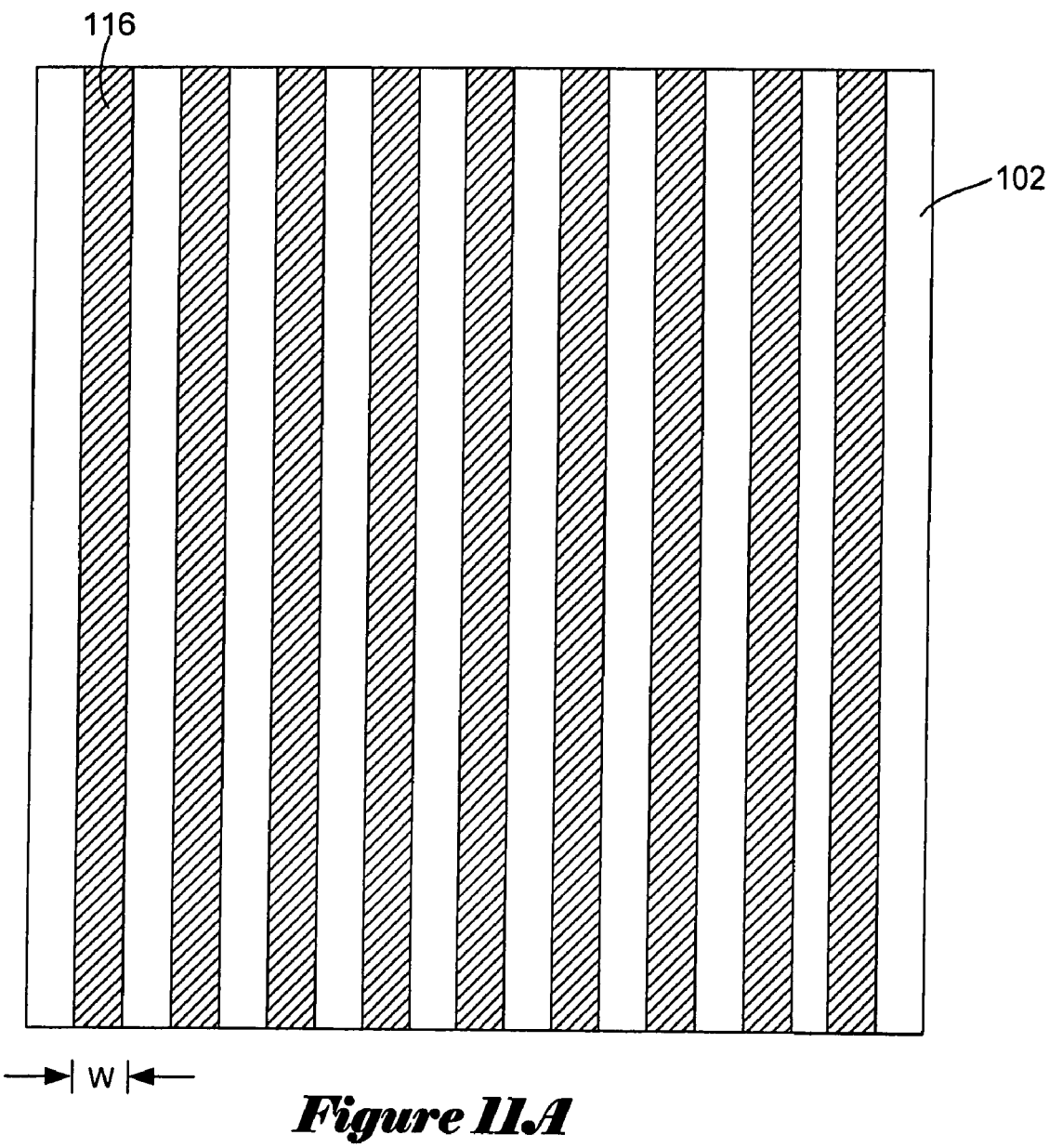
FIG. 11A is a schematic top plan view of an in-process substrate structure, formed during practice of one embodiment of a method according to the present invention, including a number of lower address lines formed from the multi-layer structure of the in-process substrate structure shown in FIG. 2.
Figure 11B:
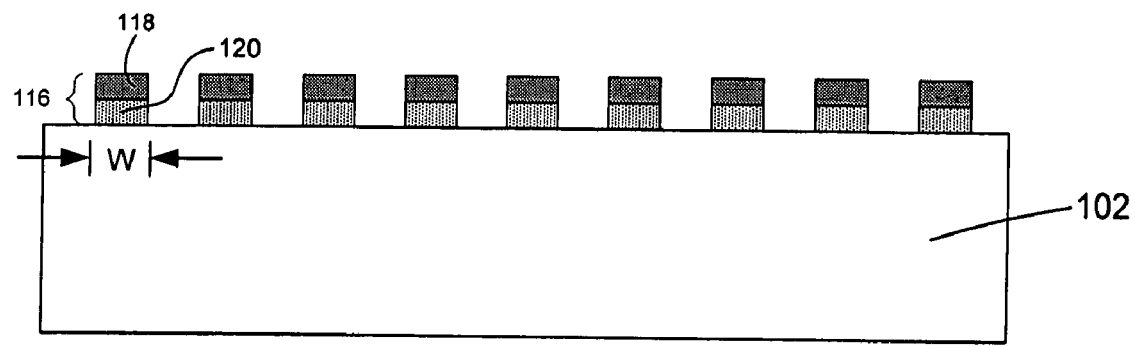
FIG. 11B is a schematic side view of the in-process substrate structure shown in FIG. 11A.
Figure 12:
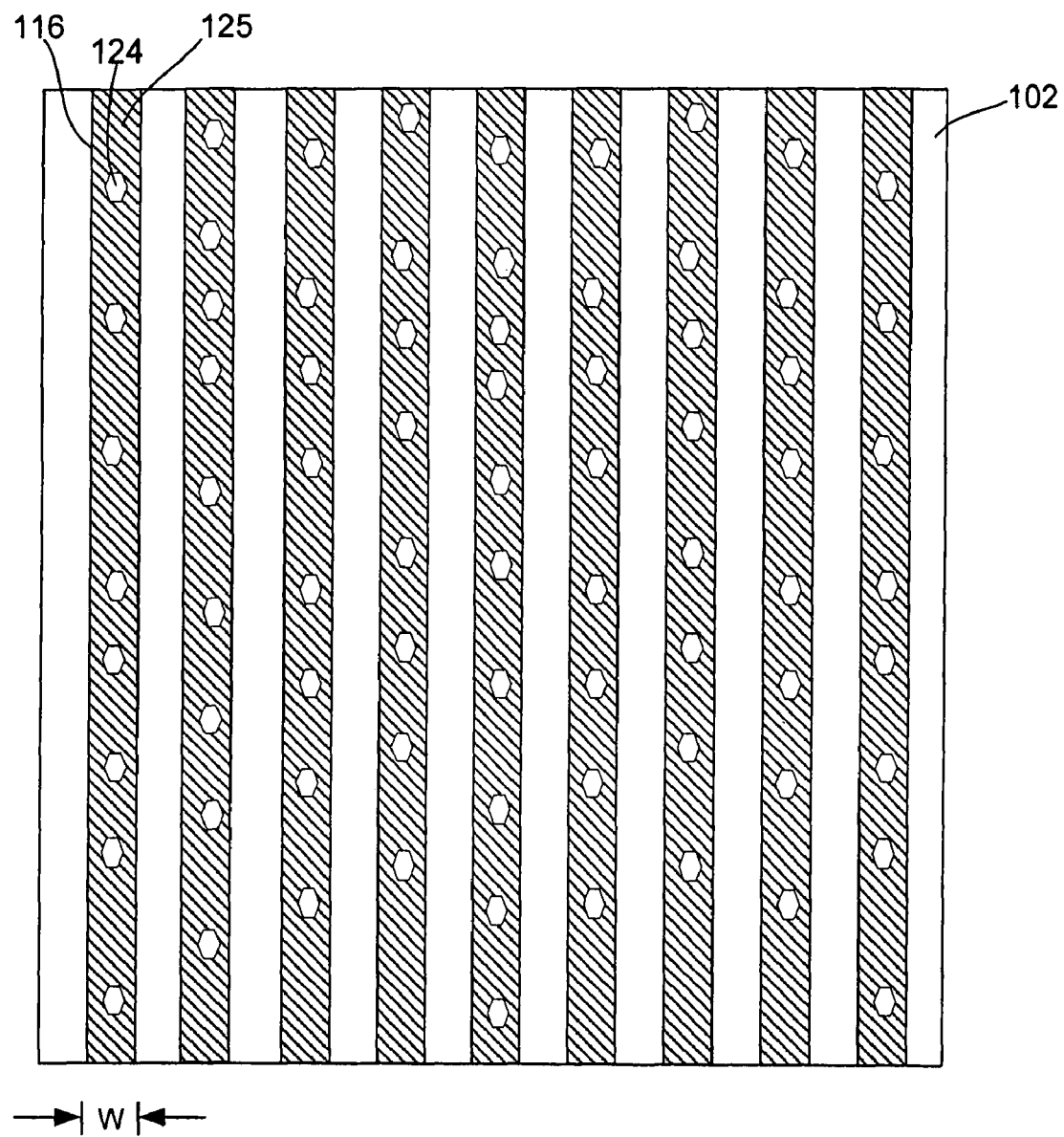
FIG. 12 is a schematic top plan view of an in-process substrate structure, formed during practice of one embodiment of a method according to the present invention, after subjecting the in-process substrate structure shown in FIGS. 11A and 11B to a thermal process to form metal-silicide crystallites in the lower address lines.
Figure 13:
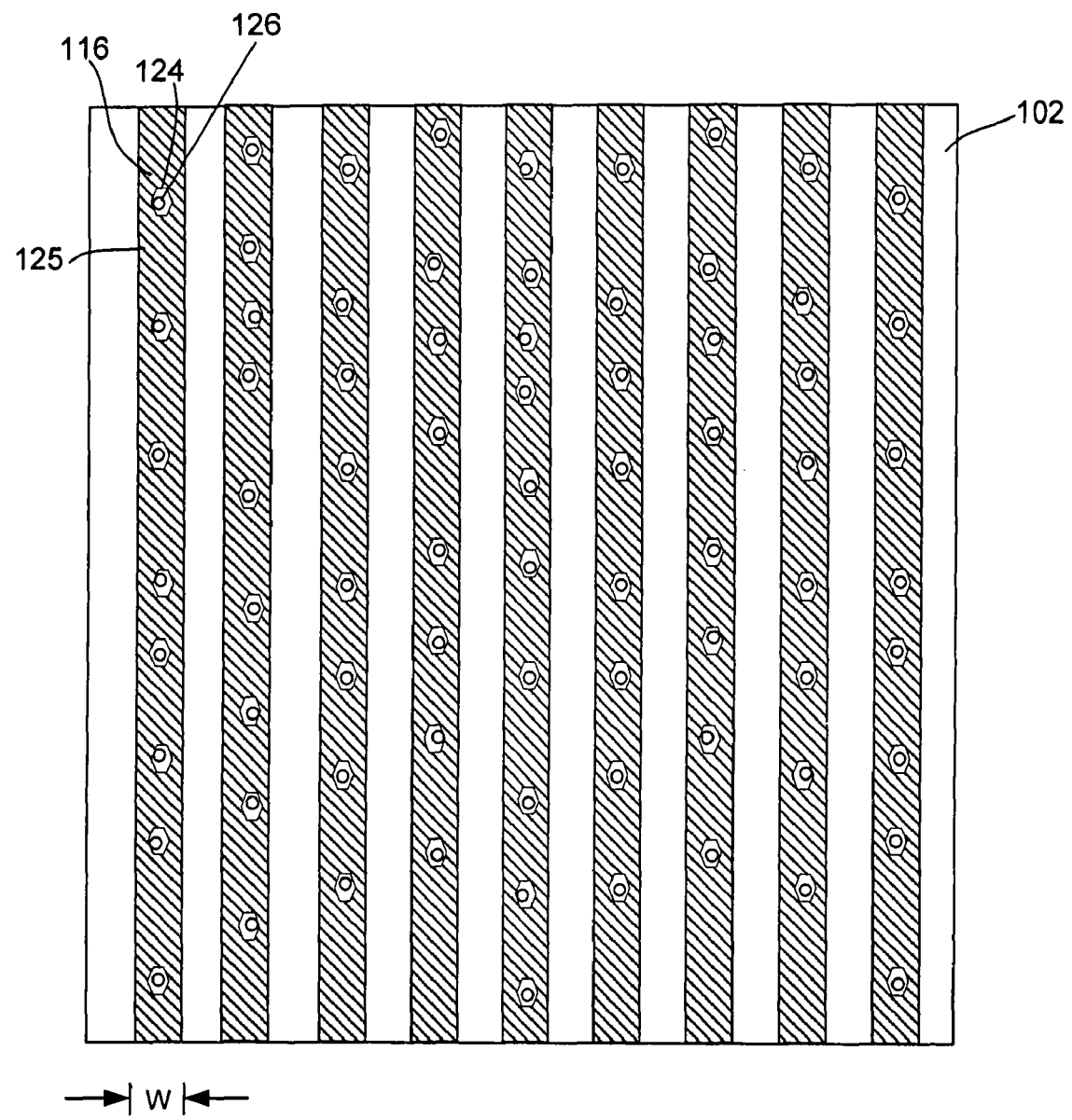
FIG. 13 is a schematic top plan view of an in-process substrate structure, formed during practice of one embodiment of a method according to the present invention, after nanostructures are preferentially grown on the metal-silicide crystallites shown in FIG. 12.

As shown in FIGS. 11A and 11B, a number of lower address lines 116 may be formed from the in-process substrate structure shown in FIG. 2 by photolithographically patterning a photoresist applied to the silicon layer 104 and etching, or another suitable fabrication technique. A width W of each of the lower address lines 116 may be, for example, about 10 nm to about 0.5 μm. Each of the lower address lines 116 includes a metallic layer 118 and a silicon layer 120. As shown in FIG. 12, the in-process substrate structure shown in FIGS. 11A and 11B may be subjected to a thermal process to form metal-silicide crystallites 124 dispersed through an amorphous matrix 125, as previously described with respect to FIGS. 3 and 4, in each of the lower address lines 116. However, in another embodiment of the present invention, the thermal process may be performed prior to forming the lower address lines. Then, as shown in FIG. 13, nanostructures 126 may be preferentially grown on the metal-silicide crystallites 124 of the lower address lines 116, as previously described with respect to FIGS. 5, 6A, and 6B. As discussed in one of embodiments described above, a separate thermal process does not need to be employed to form the metal-silicide crystallites 124 from the lower address lines 116. Instead, the temperature at which the nanostructure-growth process is performed may be sufficient to form the metal-silicide crystallites 124 and grow the nanostructures 126 shortly thereafter on the metal-silicide crystallites 124 so-formed.

Figure 14:
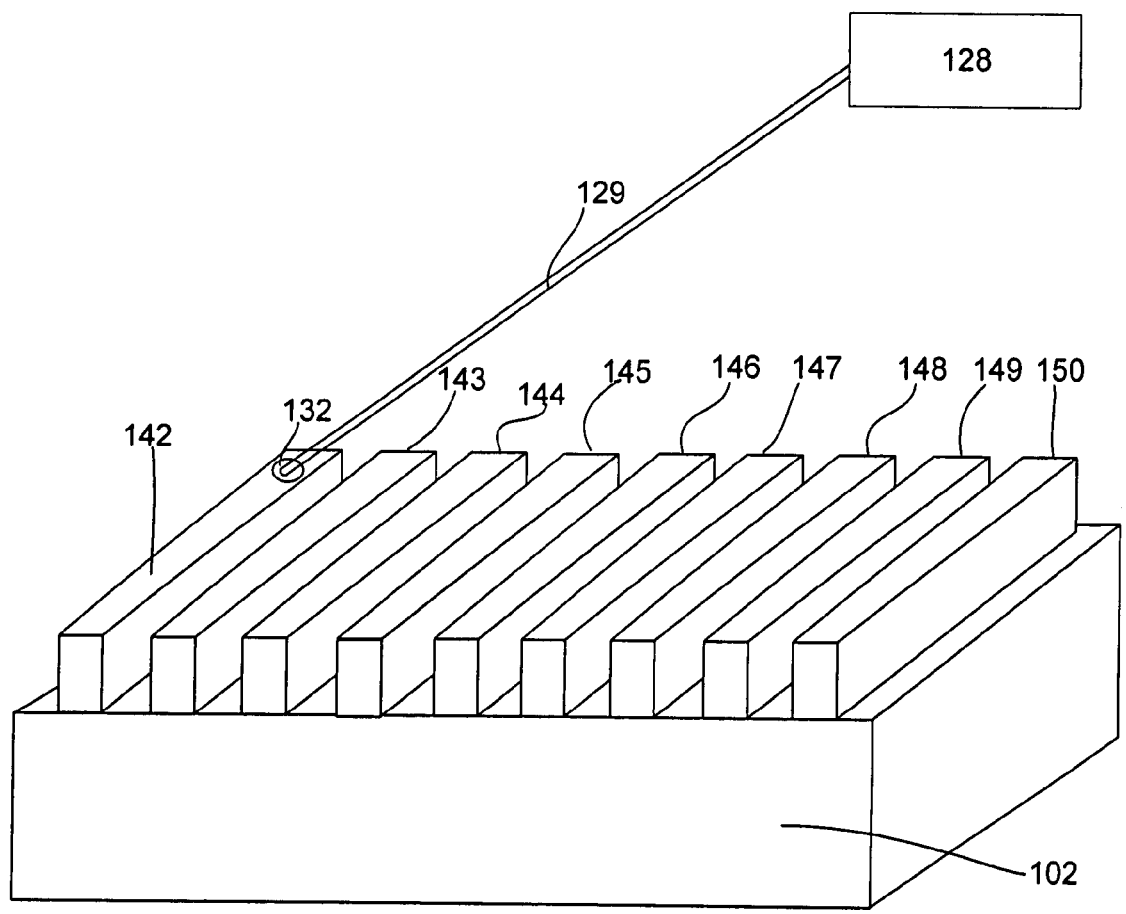
FIG. 14 is a schematic diagram illustrating an energetic beam being used to form metal-silicide crystallites at generally selected locations in the lower address lines shown in FIGS. 11A and 11B according to another embodiment of a method of the present invention.
Figure 15:
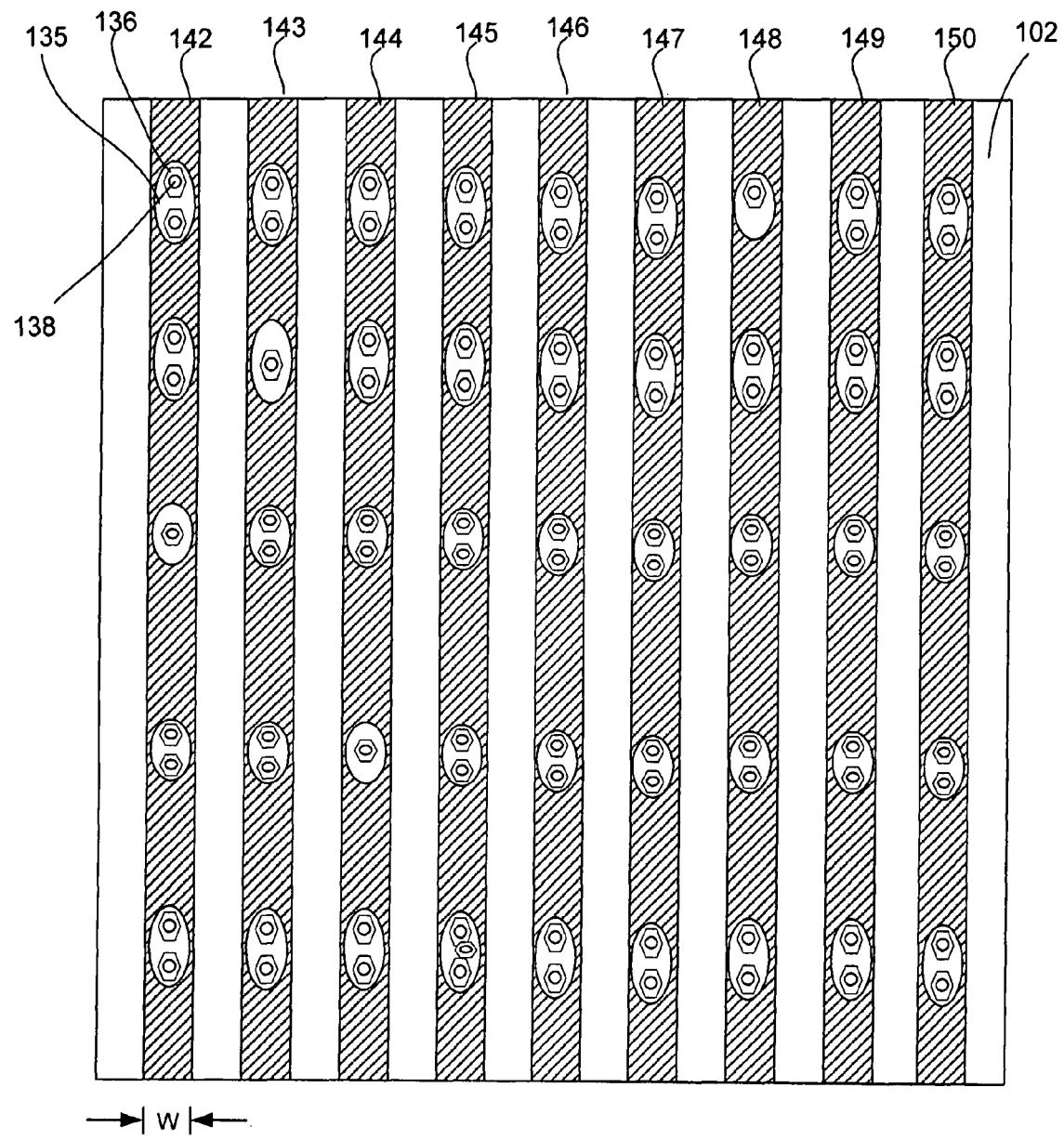
FIG. 15 is a schematic top plan view of an in-process substrate structure including multiple metal-silicide crystallites, on which nanostructures are preferentially grown, formed at selected locations along a length of lower address lines as a result of exposure to the energetic beam shown in FIG. 14.

In the method described above in FIGS. 11A through 13, in each of the lower address lines 116, the metal-silicide crystallites 124 are randomly distributed through the amorphous matrix 125. However, the metal-silicide crystallites 124 may have a preferred crystallographic orientation or texture within the amorphous matrix 125. In another embodiment of the present invention, shown in FIG. 14, metal-silicide crystallites may be formed generally at selected locations along the length of each of the lower address lines. An energetic-beam source 128, such as a short-pulsed excimer laser, an electron-beam source, an ion-beam source, or another suitable energetic-beam source, may be used to heat selected regions of lower address lines 142-150, each of which comprises a metallic layer and a silicon layer as previously described. As illustrated in FIG. 14, the energetic-beam source 128 is operable to output a beam 129 that can be focused to locally heat a selected region 132 to form one or more metal-silicide crystallites within the selected region 132. As shown in FIG. 15, by locally heating multiple, selected regions on each of the lower address lines 142-150, metal-silicide crystallites 136 are generally formed in selected locations dispersed through an amorphous matrix 135 due to a diffusive reaction between the silicon layer and the metallic layer of each of the lower address lines 142-150. The cross-hatched regions of the lower address lines 142-150 are regions in which the silicon layer and metallic layer have not reacted with each other. After selectively forming the metal-silicide crystallites 136, nanostructures 138 (e.g., nanowires and/or quantum dots) may be preferentially grown on the metal-silicide crystallites 136, as previously described. It should be noted that FIG. 15 merely shows one possible selected distribution for the metal-silicide crystallites 136 and the nanostructures 138. Other distributions may be formed by selectively exposing regions on each of the lower address lines 142-150 to the beam 129. Additionally, in each region exposed to the beam 129, the number, size, and shape of the metal-silicide crystallites 136 formed within the amorphous matrix 135 may vary. The particular geometry of each amorphous matrix 135, and the number and distribution of the metal-silicide crystallites 136 within each amorphous matrix 135 shown in FIG. 15 is merely for illustrative purposes. In yet another embodiment of the present invention, the energetic-beam source 128 may be used to form metal-silicide crystallites in a generally selected pattern within the multi-layer structure 106 shown in FIG. 2, followed by a patterning process to form the lower address lines.

Figure 16:
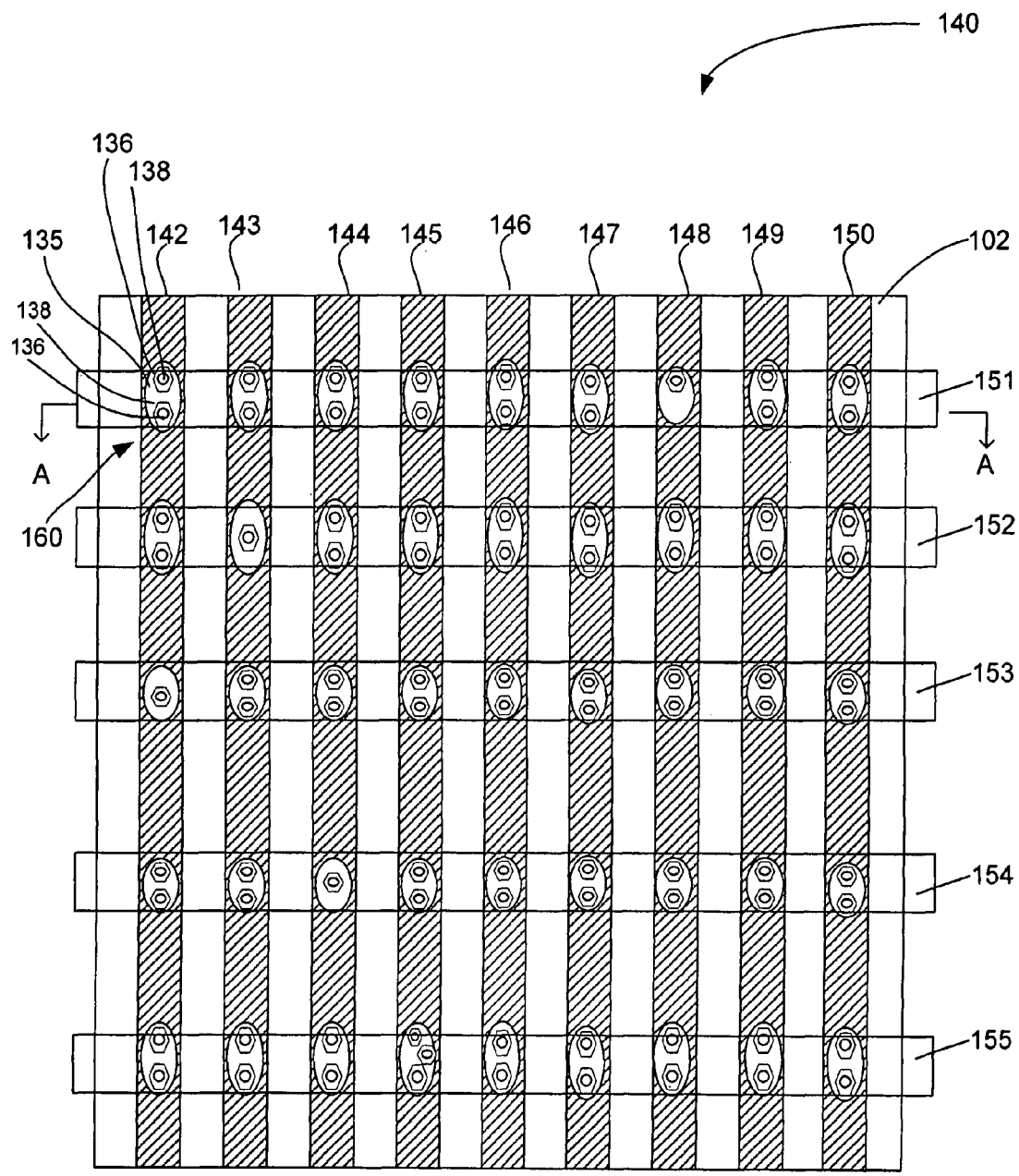
FIG. 16 is a schematic top plan view of a functional device according to one embodiment of the present invention formed by fabricating a layer of upper address lines over the lower address lines shown in FIG. 15 to enable electrically addressing the nanostructures formed on the metal-silicide crystallites of the lower address lines.

In either of the embodiments shown in FIGS. 13 or 15 in which nanostructures are grown on metal-silicide crystallites distributed in lower address lines, a layer of upper address lines may be formed over the nanostructures so that individual nanostructures or groups of nanostructures may be electrically addressed. Accordingly, next, as shown in FIG. 16, a functional device 140 according to one embodiment of the present invention is formed by fabricating a number of upper address lines 151-155 over the lower address lines 142-150 and in electrical contact with the nanostructures 138 positioned at junctions between overlying address lines. In one embodiment of the present invention suitable for optical applications, the upper address lines 151-155 may be formed from an electrically conductive and optically transparent material, such as indium tin oxide or another suitable material. Because the address lines 142-155 are electrically conductive, nanostructures located at the junctions may be electrically addressed by passing a current through overlapping address lines. For example, passing a current through the lower address line 142 and the upper address line 151 enables the nanostructures 138 located at junction 160 to be electrically addressed. Moreover, because the lower and upper address lines 142-155 may have microscale, submicroscale, or nanoscale widths, the lower and upper address lines 142-155 may be further electrically accessed by other microscale or submicroscale connection structures, such as conductive lines, wires, etc. Additionally, by forming the address lines 142-155 from material comprising metal-silicide crystallites, the address lines 142-155 exhibit an electrical conductivity substantially greater compared to highly-doped semiconductor materials. Accordingly, response time and other performance characteristics of the functional device 140 may be enhanced when the address lines are formed from metal-silicides that exhibit a low electrical resistance.

It is noted that in other embodiments of the present invention, when the nanostructures are randomly distributed along the length of each of the lower address lines, such as when the metal-silicide crystallites and nanostructures are formed as previously described with respect to FIGS. 12 and 13, a portion of the nanostructures may not be electrically connected to any of the upper address lines. However, a portion of the nanostructures are also in electrical contact with the upper address lines to enable electrically addressing individual nanostructures or groups of nanostructures.

Figure 17:
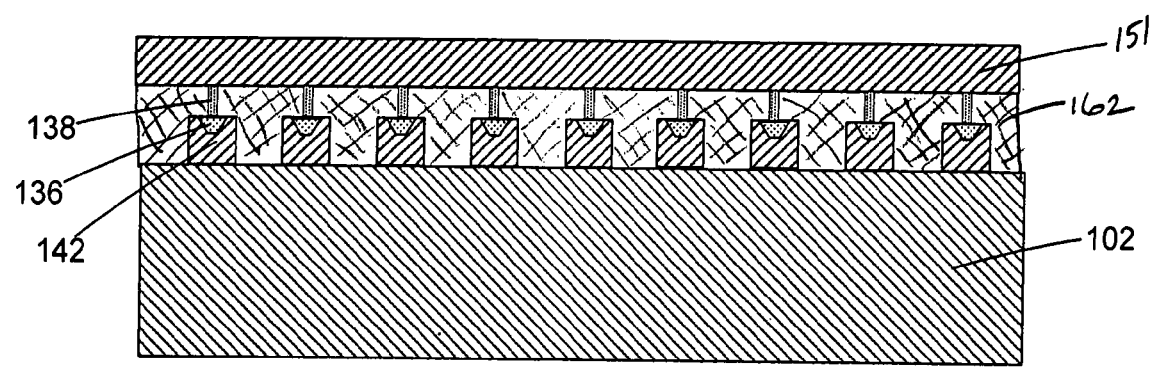
FIG. 17 is a cross-sectional view taken along line A-A shown in FIG. 16.

FIG. 17 shows a cross-sectional view of the functional device 140 taken along line A-A shown in FIG. 16 that better illustrates the structure of the junction 160. As shown in FIG. 17, before forming the upper address lines 151-155, a support material 162 (not shown in FIG. 16), such as a metal oxide, a polymeric material, a semiconductor material, or another suitable material may be deposited between adjacent lower address lines 142-150 and the nanostructures 138 grown on the adjacent lower address lines 142-150. The upper address lines 151-155 may be formed on the support material 162 and in electrical contact with the nanostructures 138 using the same or similar process used for forming the lower address lines 142-150. For example, a multi-layer structure comprising a silicon layer and a metallic layer may be deposited on the support material 162 and the nanostructures 138, and annealed to form metal-silicide crystallites. The upper address lines 151-155 may be formed by photolithographically patterning and etching the multi-layer structure or another suitable technique before or after annealing the multi-layer structure. As with the device component 115 shown in FIG. 7, ends of the nanostructures may be exposed prior to forming the upper address lines 151-155 by planarizing or etching the support material 162 and the nanostructures 138 in order to facilitate consistent electrical contact between the upper address lines 151-155 and the nanostructures 138.

In one embodiment of the present invention, when the nanostructures, such as the nanostructure 138 are quantum dots, the support material 162 may be a semiconductor material having an energy band gap selected to be greater than that of the energy band gap of the quantum dot. In another embodiment of the present invention, the support material 162 may be selectively removed after forming the upper address lines 151-155. Accordingly, a variety of different types of devices may be formed by electrically coupling overlapping address lines to the nanostructures. For example, when the nanostructures comprise a semiconductor material, the junction 160 forms a MSM diode in which the electrically conductive lower and upper address lines function as the metal electrodes. As best shown in FIG. 16, the lower address line 142 and the upper address line 151 form the metal electrodes of a MSM diode and the nanostructures 138 form the semiconductor component of the MSM diode.

The following working example of the present invention sets forth one method that has been used to fabricate InP nanowires on a non-single-crystal substrate. The following working example provides further detail in connection with the various embodiments of the present invention described above.

WORKING EXAMPLE

An approximately 300 nm thick chromium layer was deposited on a glass substrate using electron-beam evaporation. The glass substrate was maintained at a temperature of about 50° Celsius during the evaporation process. An approximately 100 nm thick hydrogenated amorphous silicon layer was deposited on the chromium layer using PECVD. Silane and hydrogen were used as the precursor gases in the PECVD process. The glass substrate was maintained at a temperature of about 250° Celsius during deposition of the hydrogenated amorphous silicon layer. InP nanowires were grown by MOCVD using trimethylindium and phosphine in a hydrogen carrier gas. The glass substrate, including the hydrogenated amorphous silicon layer and the chromium layer, were pre-heated to a temperature of about 630° Celsius in hydrogen for 5 minutes and InP nanowires were grown at 430° Celsius. The growth pressure was about 76 Torr. During the MOCVD process, the hydrogenated amorphous silicon layer and the chromium layer reacted to form CrSi and $CrSi_2$ crystallites dispersed through an amorphous matrix. The InP quantum dots preferentially grew on the chromium-silicide crystallites formed during the MOCVD process. X-ray diffraction was used to determine the type of chromium-silicide phases and also confirmed that the chromium-silicide crystallites exhibited a (111) texture.

Although the present invention has been described in terms of particular embodiments, it is not intended that the present invention be limited to these embodiments. Modifications within the spirit of the present invention will be apparent to those skilled in the art. For example, in another embodiment of the present invention, each of the nanostructures may comprise a p-n junction, an n-p-n structure, a p-n-p structure, or compositionally dissimilar materials (i.e., heterostructures) for forming a number of different types of semiconductor devices. Such semiconductor structures may be formed by altering the composition of the precursor gas used for growing the nanostructures.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents:

The invention claimed is:

1. A method of forming nanostructures, comprising:
   forming a metallic layer on a substrate;
   forming a silicon layer on the metallic layer;
   subjecting the multi-layer structure to a thermal process to form metal-silicide crystallites; and
   growing the nanostructures on the metal-silicide crystallites.

2. The method of claim 1 wherein subjecting the multi-layer structure to a thermal process to form metal-silicide crystallites comprises annealing the metallic layer and the silicon layer prior to growing the nanostructures.

3. The method of claim 1 wherein each of the nanostructures comprises one of:
   a quantum dot; and
   a nanowire.

4. The method of claim 1:
   wherein subjecting the multi-layer structure to a thermal process to form metal-silicide crystallites comprises forming a first electrode including the metal-silicide crystallites; and
   further comprising forming a second electrode over the nanostructures and in electrical contact with at least a portion of the nanostructures.

5. The method of claim 1, further comprising:
   prior to growing the nanostructures, forming a first layer of address lines each of which comprises the metal-silicide crystallites; and
   forming a second layer of address lines over the first layer of address lines to form a number of junctions, at least a portion of the junctions comprising one or more of the nanostructures.

6. The method of claim 1:
   further comprising prior to subjecting the multi-layer structure to the thermal process, forming a number of address lines each of which includes a portion of the metallic layer and a portion of the silicon layer; and
   wherein subjecting the multi-layer structure to a thermal process to form metal-silicide crystallites comprises exposing selected regions of the address lines to an energetic beam.

7. The method of claim 1 wherein subjecting the multi-layer structure to a thermal process to form metal-silicide crystallites comprises exposing selected regions of the multi-layer structure to an energetic beam.

8. The method of claim 1:
   wherein subjecting the multi-layer structure to a thermal process to form metal-silicide crystallites comprises forming a reaction layer comprising the metal-silicide crystallites;
   further comprising forming first and second spaced electrodes from the reaction layer; and
   wherein growing the nanostructures on the metal-silicide crystallites comprises growing the nanostructures on the metal-silicide crystallites of the first and second spaced electrodes so that the nanostructures span between the first and second spaced electrodes.

9. The method of claim 1:
   wherein the multi-layer structure comprises first and second spaced electrodes;
   wherein subjecting the multi-layer structure to a thermal process to form metal-silicide crystallites comprises forming the metal-silicide crystallites in the first and second spaced electrodes; and
   wherein growing the nanostructures on the metal-silicid crystallites comprises growing the nanostructures on the metal-silicide crystallites of the first and second spaced electrodes so that the nanostructures span between the first and second spaced electrodes.

10. The method of claim 1 wherein the silicon layer comprises one of:
    amorphous silicon; and
    silicon crystallites dispersed through a matrix comprising amorphous silicon.

* * * * *

UNITED STATES PATENT AND TRADEMARK OFFICE
CERTIFICATE OF CORRECTION

PATENT NO. : 7,754,600 B2  Page 1 of 1
APPLICATION NO. : 11/712632
DATED : July 13, 2010
INVENTOR(S) : Nobuhiko Kobayashi et al.

It is certified that error appears in the above-identified patent and that said Letters Patent is hereby corrected as shown below:

In column 12, line 33, in Claim 9, delete "metal-silicid" and insert -- metal-silicide --, therefor.

Signed and Sealed this

Sixteenth Day of November, 2010

David J. Kappos
*Director of the United States Patent and Trademark Office*